US011529937B2

(12) United States Patent
Horton

(10) Patent No.: US 11,529,937 B2
(45) Date of Patent: Dec. 20, 2022

(54) CONTROL CIRCUIT FOR OPERATING INDUCTIVE LOAD DEVICES, A BRAKING SYSTEM, AND A VEHICLE INCLUDING A BRAKING SYSTEM

(71) Applicant: Haldex Brake Products Aktiebolag, Landskrona (SE)

(72) Inventor: Steven Horton, Lindely (GB)

(73) Assignee: Haldex Brake Products Aktiebolag, Landskrona (SE)

( * ) Notice: Subject to any disclaimer, the term of this patent is extended or adjusted under 35 U.S.C. 154(b) by 825 days.

(21) Appl. No.: 16/303,794

(22) PCT Filed: May 26, 2017

(86) PCT No.: PCT/GB2017/051519
§ 371 (c)(1),
(2) Date: Nov. 21, 2018

(87) PCT Pub. No.: WO2017/203289
PCT Pub. Date: Nov. 30, 2017

(65) Prior Publication Data
US 2020/0317172 A1 Oct. 8, 2020

(30) Foreign Application Priority Data
May 27, 2016 (GB) .................................. 1609369

(51) Int. Cl.
*H02H 7/00* (2006.01)
*B60T 8/176* (2006.01)
(Continued)

(52) U.S. Cl.
CPC ................ *B60T 8/176* (2013.01); *G01R 1/30* (2013.01); *G01R 19/257* (2013.01); *H01F 7/064* (2013.01);
(Continued)

(58) Field of Classification Search
None
See application file for complete search history.

(56) References Cited

U.S. PATENT DOCUMENTS 4,967,309 A 10/1990 Hoffman
5,381,297 A 1/1995 Weber
(Continued)

FOREIGN PATENT DOCUMENTS

DE 102007053038 A1 5/2009
EP 0393847 A1 10/1990
(Continued)

OTHER PUBLICATIONS

International Search Report and Written Opinion, PCT/GB2017/051519, dated Sep. 11, 2017.
(Continued)

*Primary Examiner* — Stephen W Jackson
(74) *Attorney, Agent, or Firm* — Young Basile Hanlon & MacFarlane, P.C.

(57) ABSTRACT

A control circuit for controlling the operation of a main switch device which manages an electrical current delivered to an inductive load device, the control circuit including: a current sense circuit configured to be coupled to the switch device and to output a signal representative of an electrical current through the inductive load device; a current comparator circuit configured to receive an actuation command signal, compare the signal representative of the electrical current through the inductive load device with a signal representative of a predetermined current, and to output a control signal based on the comparison for controlling the operation of the main switch device when the actuation command signal indicates that the inductive load device is to be activated; and a recirculation circuit configured to recirculate current through the inductive load device, such that the current used to activate the inductive load device is (Continued)

selectively provided by the main switch device and the recirculation circuit.

16 Claims, 13 Drawing Sheets

(51) Int. Cl.
    *G01R 1/30*     (2006.01)
    *G01R 19/257*     (2006.01)
    *H01F 7/06*     (2006.01)
    *H01F 7/18*     (2006.01)
    *H02M 1/00*     (2006.01)

(52) U.S. Cl.
    CPC ......... *H01F 7/1844* (2013.01); *H02M 1/0009* (2021.05)

(56) References Cited

U.S. PATENT DOCUMENTS

| | | |
|---|---|---|
| 6,351,162 B1 | 2/2002 | Schwartz |
| 2002/0113582 A1 | 8/2002 | Peduto et al. |
| 2004/0078132 A1* | 4/2004 | Fey .......................... B60T 8/36 |
| | | 701/70 |
| 2008/0238391 A1 | 10/2008 | Williams et al. |
| 2015/0303805 A1* | 10/2015 | Franchini ............... H03K 17/18 |
| | | 324/503 |
| 2015/0377933 A1 | 12/2015 | Alcouffe et al. |

FOREIGN PATENT DOCUMENTS

| | | |
|---|---|---|
| EP | 1657726 A1 | 5/2006 |
| GB | 2368210 A | 4/2002 |
| JP | S62142666 A | 6/1987 |
| WO | 2014060787 A1 | 4/2014 |

OTHER PUBLICATIONS

United Kingdom Intellectual Property Office Search Report for United Kingdom Patent Application No. GB1609369.2, dated Sep. 22, 2016.

* cited by examiner

//CONTROL CIRCUIT FOR OPERATING INDUCTIVE LOAD DEVICES, A BRAKING SYSTEM, AND A VEHICLE INCLUDING A BRAKING SYSTEM

CROSS-REFERENCE TO RELATED APPLICATIONS

This application is a United States national stage application of, and claims priority to, International Application No. PCT/GB2017/051519 filed May 26, 2017, which was published as International Publication No. WO 2017/203289. International Application No. PCT/GB2017/051519 claims the benefit of United Kingdom Patent Application No. 1609369.2, filed May 27, 2016.

BACKGROUND OF THE INVENTION

Embodiments of the present invention relate to control circuits for controlling activation of inductive load devices such as for controlling the operation of actuators with electromagnetic coils (such as solenoids and relays) or other inductive loads. In particular, some embodiments include control circuits for controlling the operation of actuators used in a braking system associated with a vehicle.

Automotive braking systems commonly use electrically actuated pneumatic valves in their operation. The actuation of the valves may be achieved by the use of solenoids. Similarly, solenoids are used in numerous other automotive applications—including fuel injection systems and automatic transmission systems.

A control processor will typically drive the operation of a switch device (such as a transistor-based device) to control the electric current supplied to a coil of the solenoid. An electric current passing though the coil generates a magnetic field which causes movement of a linear actuator of the solenoid. In an "on" state a current is passing through the coil and in an "off" state there is no, or only a very low, current passing through the coil. The solenoid may be designed such that, in the on state, the linear actuator is retracted with respect to the coil of the solenoid and in an "off" state the linear actuator is extended with respect to the coil of the solenoid, or vice versa (as will be understood, a biasing device such as a spring may be used to achieve the desired extended or retracted position of the linear actuator when the solenoid is in the off state).

In many automotive, and other applications, solenoids are required to switch between the on and off states frequently during normal operation. Accordingly, the cumulative effect of electric power lost as a result of the current passing through the coils is not insubstantial.

The control processor may drive the operation of the switch device according to a pulse width modulated control signal—which helps to reduce the power lost through the coils during operation.

Fast actuation of solenoids is also a common requirement in many applications—particularly in automotive braking systems, for example. One or more solenoids in an automotive braking system may, for example, control the operation of a brake of a vehicle of which the automotive braking system is a part. Therefore, the slow actuation of the one or more solenoids may mean a delayed response to a braking command from a driver or braking control system and this may have safety implications on the operation of the vehicle. In conventional circuits, a recirculation current due to the inductance of the coil of the solenoid may reduce the speed of actuation (e.g. release) of the solenoid and additional circuitry is required to reduce this effect (potentially under the control of the control processor).

Solenoid operation in some automotive applications is further complicated by different operating voltages and the effect of variations in the temperature of the coils of the solenoids during use.

For example, braking systems used in many applications (particularly towed trailers) may be required to operate over a wide range of different voltage levels dependent on the operating voltage of the braking system of the vehicle—which may be different in different countries or regions, for example.

As current passes through the coil of a solenoid, the resistance of the coil causes the coil to increase in temperature which, in turn, changes the resistance of the coil and the current passing through the coil for a given voltage. As a result, in order to achieve the desired operation of the solenoid, some conventional circuits vary the operation of the switch device—e.g. by altering the duty cycle of a pulse width modulated signal—in order to compensate for the variations in coil temperature which are expected to occur. Typically, this requires overcompensation for this effect which, in turn, reduces the overall efficiency of the system. Similarly, tolerances in the manufacture of solenoids means that over compensation is also required to cover the full range of possible coil resistances which may be encountered in practice.

In a typical automotive application, the voltage of the electrical supply which is used to power the operation of the solenoids (using the switch devices) varies over time. Accordingly, conventional control processors normally need to monitor the voltage of the electrical supply and vary the operation of the switch devices to compensate for variations in the voltage. Again, this leads to over compensation and a larger amount of power lost through the solenoids.

In order to reduce the number of components in systems which include a plurality of solenoids it is also conventional to include a single recirculation circuit for all of the solenoids. However, in order to allow for a fast transition from the on state to the off state for one of the plurality of solenoids, whilst maintaining one or more others of the solenoids in the on state, it is necessary to increase the duty cycle of the current provided to those one or more other solenoids in order to reduce the risk (or substantially prevent) their unintended actuation from the on to the off state. The increased duty cycle means that more current is passing through the coils of those solenoids than would otherwise be needed and so the power loss is higher than would otherwise be the case.

There is, therefore, a need to alleviate one or more problems associated with prior systems for driving the operation of solenoids and other actuators with electromagnetic coils (such as relays). The same or similar problems exist in relation to the operation of other inductive load devices which, likewise, there is a need to alleviate.

SUMMARY OF THE INVENTION

Accordingly, an aspect provides a control circuit for controlling the operation of a main switch device which manages an electrical current delivered to an inductive load device, the control circuit including: a current sense circuit configured to be coupled to the switch device and to output a signal representative of an electrical current through the inductive load device; a current comparator circuit configured to receive an actuation command signal, compare the signal representative of the electrical current through the inductive load device with a signal representative of a predetermined electrical current, and to output a control signal based on the comparison for controlling the operation of the main switch device when the actuation command signal indicates that the inductive load device is to be activated; and a recirculation circuit configured to recirculate electrical current through the inductive load device, such that the electrical current used to activate the inductive load device is selectively provided by the main switch device and the recirculation circuit.

The recirculation circuit may be configured to provide a recirculation path for the electrical current through the inductive load device selectively, such that when the actuation command signal indicates that the inductive load device is to be deactivated, recirculation of the electrical current is ceased.

The control circuit may further comprise a main switch device drive circuit which is configured to receive the control signal from the current comparator circuit and to drive the operation of the main switch device in accordance with the control signal.

The control circuit may further comprise a current shaping circuit which is configured to: (i) provide a predetermined shape to the signal representative of the predetermined electrical current such that the signal representative of the predetermined electrical current is initially high in order to provide a high pull-in current for the inductive load device and subsequently decreases to provide a hold-in current for the inductive load device; and/or (ii) to cause a limit to be applied on the rate of rise of the electrical current through the inductive load device.

The current shaping circuit may include a processor configured to output a signal indicative of the signal representative of the predetermined current.

The control circuit may further comprise a short circuit detection circuit which is configured to detect a short circuit fault and to modify the signal representative of the electrical current through the inductive load device or the signal representative of the predetermined electrical current, such that the control signal may be modified to reduce the electrical current through the inductive load device.

The current comparator circuit may include a comparator which is configured to compare the signal representative of the electrical current through the inductive load device with the signal representative of the predetermined electrical current.

The comparator circuit may include a ripple control circuit which is configured to control at least one of the ripple frequency and ripple amplitude of the electrical current through the inductive load device.

The current comparator circuit may include a current source circuit which is configured to provide the signal representative of the predetermined electrical current.

The inductive load device may include a coil and may be a solenoid or relay.

The control circuit may further include an inductance determining circuit which is configured to determine an inductance of the inductive load device and to derive a state of operation of the inductive load device from the determined inductance.

Another aspect provides a braking system for a vehicle, the braking system including: a control circuit as above; an inductive load device which is configured to be controlled by the control circuit; and the main switch device.

Another aspect provides a vehicle including a braking system as above.

The vehicle may include a truck with the braking system located in the truck or a truck and a trailer with the braking system located in the trailer and/or the truck.

BRIEF DESCRIPTION OF THE DRAWINGS

Embodiments of the present invention are described, by way of example only, with reference to the accompanying drawings, in which.

DETAILED DESCRIPTION OF THE EMBODIMENT

Figure 1:
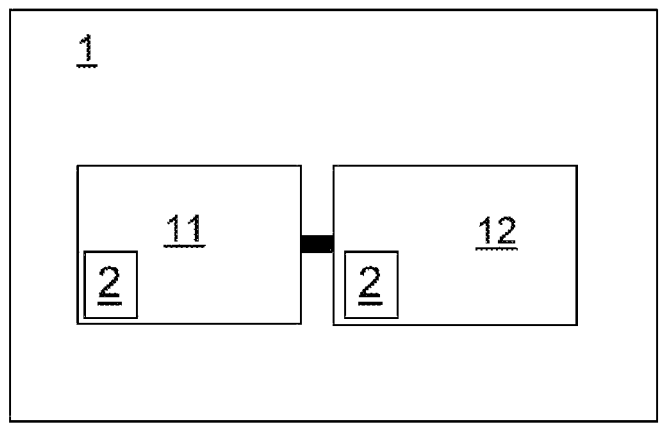
FIG. 1 shows a schematic representation of a vehicle according to some embodiments.

In some embodiments, see FIG. 1 for example, the present invention includes a vehicle 1 to which a braking system 2 has been fitted. The vehicle 1 may include a truck 11 and trailer 12, the trailer 12 being configured to be towed by the truck 11. The braking system 2 may, therefore, include a portion which is part of the truck 11 and a portion which is part of the trailer 12. Other configurations of the braking system 2 and the vehicle 1 may, however, be used in other embodiments. For example, the braking system 2 may form part of the truck 11 which may or may not be configured to tow the trailer 12. The braking system 2 may be configured to restrain selectively the rotation of one or more ground engaging wheels of the vehicle 1 (e.g. of the trailer 12).

The vehicle 1 includes an electrical supply system 3 (see FIG. 2), which is configured to provide electrical power to one or more units of the vehicle 1, including the braking system 2. The electrical supply system 3 may include a battery 31 and a generation system 32 (such as an electrical alternator or other generator) which is configured to generate electricity using mechanical power generated by an engine of the vehicle 1, for example.

The electrical supply system 3 may be configured to output electrical power at a plurality of different voltages along respective supply lines or connections. For example, the electrical supply system 3 may be configured to output a first supply voltage which is substantially equal to the voltage of the electrical power output by the battery 31 or generated using the generation system 32, $V_B$ (see FIG. 4, for example). The electrical supply system 3 may be further configured to output a second supply voltage which is substantially equal to $V_B$ plus a predetermined voltage, $V_S$. The second supply voltage may, therefore, be referred to as voltage, $V_{BS}$. In some embodiments, the predetermined voltage, $V_S$, is around or greater than about 5V and so the second supply voltage is $V_B+5V$ or more. The first supply voltage, $V_B$, may be 12V or 24V for example.

In order to generate the second supply voltage, $V_{BS}$, the electrical supply system 3 may include a DC-DC converter 33 (see FIG. 2, for example), such as a charge pump, which is configured to receive electrical power at a first input voltage (which may be equal to the first supply voltage, $V_B$) and to output electrical power at a first output voltage (which may be equal to the second supply voltage, $V_{BS}$). In some embodiments, there are a number of DC-DC conversion stages to achieve the second supply voltage—e.g. two or more. In some embodiments, the DC-DC converter 33 is part of the braking system 2 rather than the electrical supply system 3 as such.

As will be appreciated, the electrical supply system 3 may include a first output connection or line, a second output connection or line, and a ground connection or line. The first output connection or line may be configured to provide an electrical power output relative to the ground connection or line which is at the first supply voltage. The second output connection or line may be configured to provide an electrical power output relative to the ground connection or line which is at the second supply voltage. The ground connection or line may, therefore, be referred to as a common ground for the electrical supply system 3.

Figure 4:
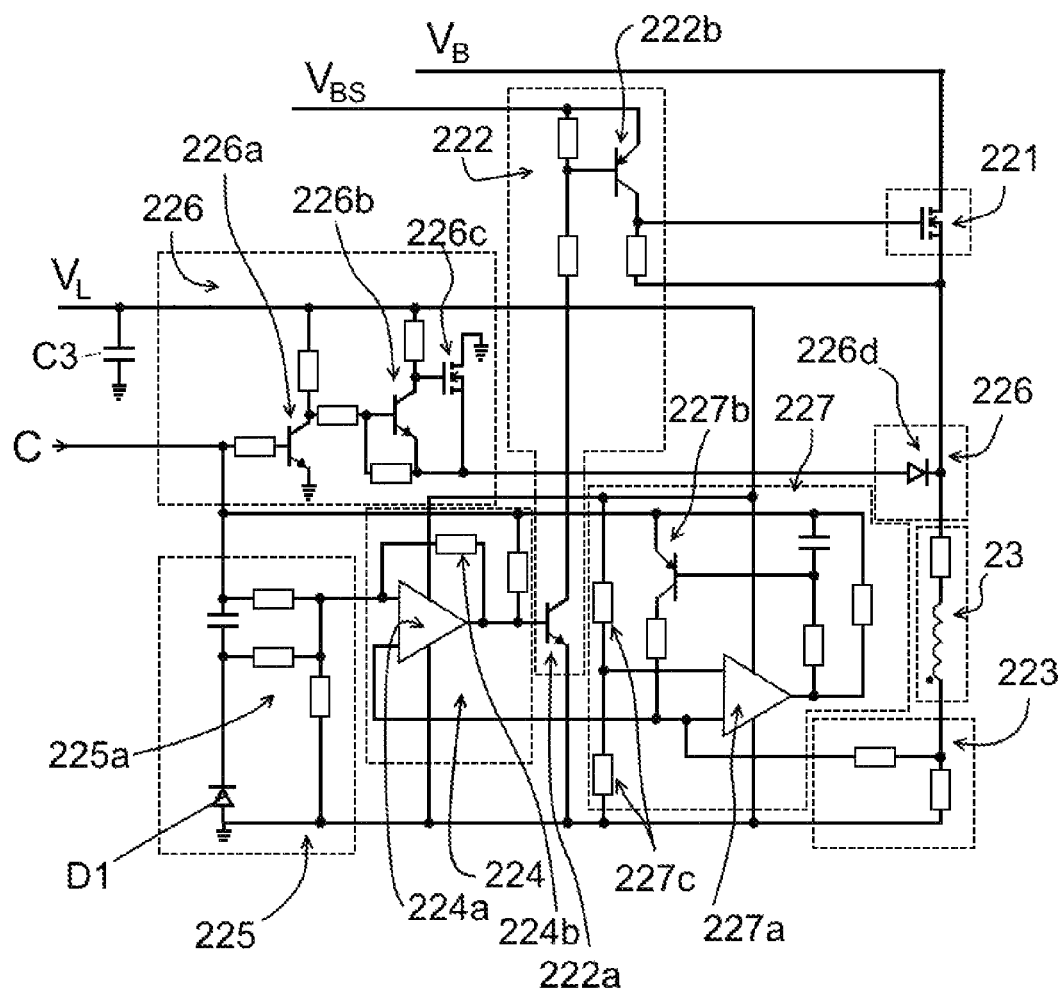
FIG. 4 shows a circuit diagram for a control circuit of some embodiments.

In addition, in some embodiments, the electrical supply system 3 is further configured to output electrical power at a voltage suitable for powering one or more logic circuits or controllers used in the vehicle 1, $V_L$ (see FIG. 4, for example). This may include elements of the braking system 2. This voltage may, therefore, be at about 3V or 5V, for example relative to the ground connection or line. The electrical power output at this logic circuit voltage may be output to a logic circuit power connection or line, and may be a regulated power supply (and, in which case, the electrical supply system 3 may include a regulator).

The braking system 2 includes or is configured to be connected to a solenoid 23 (schematically shown in FIG. 2 for example) which is configured to be actuated between extended and retracted configurations, and which is coupled to another part of the braking system 2 to control the operation of that part of the braking system 2. For example, in some embodiments, the solenoid 23 is coupled to a valve 24 (which may be a pneumatic valve) such that actuation of the solenoid 23 between the extended and retracted configurations causes actuation of the valve 24 between two states of operation (e.g. open and closed, or vice versa).

The solenoid 23 includes a linear actuator 23a and a coil 23b which are configured such that movement of the linear actuator 23a with respect to the coil 23b in at least one direction is driven by a magnetic field generated by the coil 23b as a result of an electrical current passing through the coil 23b. Accordingly, with the solenoid 23 in the extended configuration, the linear actuator 23a may be in an extended position with respect to the coil 23b, and, with the solenoid 23 in the retracted configuration, the linear actuator 23a may be in a retracted position with respect to the coil 23b. A biasing mechanism may be provided to bias the linear actuator 23a towards the extended or retracted position (i.e. to bias the solenoid 23 into the extended or retracted configuration).

The braking system 2 further includes a control circuit 22 which is connected or connectable to the solenoid 23 and which is configured to receive an actuation command signal and to control the operation (i.e. activation) of the solenoid 23 in accordance with the actuation command signal.

Figure 2:
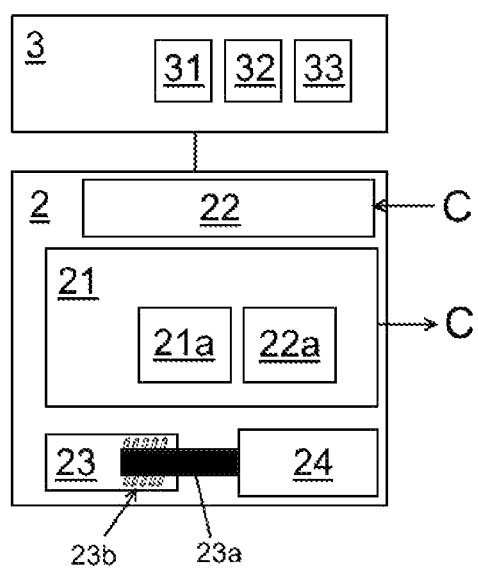
FIG. 2 shows a schematic representation of a braking system and electrical supply system of some embodiments.

The actuation command signal may be generated by, for example, a control system 21 (see FIG. 2, for example). The control system 21 may include a mechanism 21a for receiving user (e.g. driver) input and/or a braking control processor 21b. The braking control processor 21b may be configured to generate the actuation command signal based, C, on information which the braking control processor 21b receives from one or more sources (including, for example, one or more sensors for sensing parameters associated with the operation of the vehicle 1 and/or the mechanism 21a for receiving user input). The braking control processor 21b is configured, therefore, to generate the actuation command signal in order to command a desired operation of a part of the braking system 2, such as the valve 24 which may be coupled to the solenoid 23. This may, for example, actuate the brakes of the vehicle 1 or of a part of the vehicle 1 (such as the trailer 12).

As will be appreciated, the mechanism 21a may receive user input and be part of the truck 11 of the vehicle 1. The braking control processor 21b may be part of the truck 11 or part of the trailer 12 (in embodiments including the trailer 12).

Figure 3:
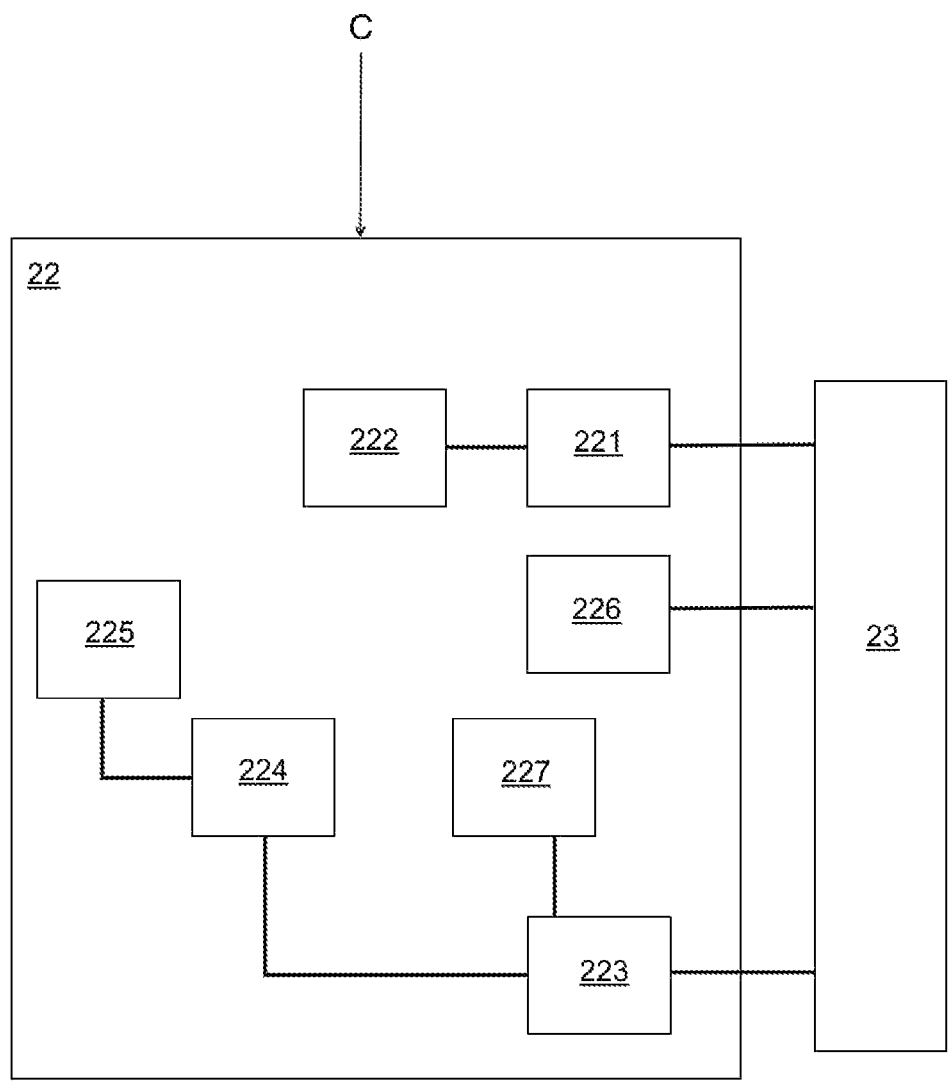
FIG. 3 shows a schematic representation of a control circuit of some embodiments.

The control circuit 22 (which receives the actuation command signal) includes a main switch device 221 (see FIGS. 3 and 4), the actuation of which determines whether an electrical current is delivered to the coil 23b of the solenoid 23. Accordingly, in an off-state of the main switch device 221, electrical current is not provided to the coil 23b of the solenoid 23, and, in an on-state of the main switch device 221, electrical current is provided to the coil 23b of the solenoid 23.

In some embodiments, with the main switch device 221 in the on-state, the solenoid 23 is in the retracted configuration and, with the main switch device 221 in the off-state, the solenoid 23 is in the extended configuration.

The main switch device 221 may, therefore, be connected or connectable in electrical communication with the electrical supply system 3 and, in some embodiments in particular, with the first output connection or line. The main switch device 221 may further be connected or connectable in electrical communication with the solenoid 23 and, in particular, with the coil 23b of the solenoid 23. The coil 23b of the solenoid 23 may be further connected or connectable in electrical communication with the ground connection or line via one or more other components—as described herein. Accordingly, the main switch device 221 and solenoid 23 may be connected in series with each other between two connections or lines of the electrical supply system 3.

For example, the main switch device 221 and coil 23b of the solenoid 23 may be connected in series with each other between the first output connection or line of the electrical supply system 3 and the ground connection or line of the electrical supply system 3. In such embodiments, with the main switch device 221 in the on-state, the voltage across the coil 23b of the solenoid 23 may be substantially equal to the first supply voltage, $V_B$.

The main switch device 221 may be a transistor-based device and may, therefore, include a field effect transistor (FET) device which may be an n-channel or a p-channel FET device. In FIG. 4, an example embodiment is depicted which uses an n-channel MOSFET device with the drain of the MOSFET connected in electrical communication to the first output connection or line, and the source of the MOSFET connected in electrical communication with the coil 23b. In embodiments which use a p-channel FET device as the main switch device 221, it may not be necessary to provide the relatively high second supply voltage, $V_{BS}$.

Figure 6:
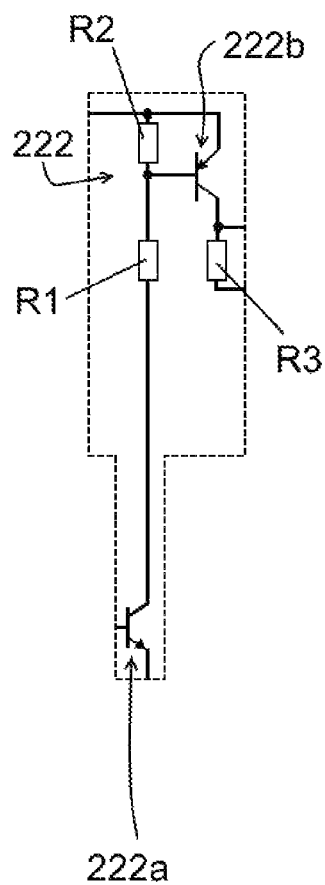
FIG. 6 shows a part of the circuit diagram of FIG. 4 relating to a main switch device drive circuit of some embodiments.

Operation of the main switch device 221 may be driven by a main switch device drive circuit 222 (or level translator) of the control circuit 22 (see FIGS. 4 and 6, for example). The main switch device drive circuit 222 may be configured to drive operation of the main switch device 221 in response to a control signal from a current comparator circuit 224. As will be appreciated, this may include the main switch device drive circuit 222 acting as a level translator.

The main switch device drive circuit 222 may, therefore, be connected in electrical communication with the main switch device 221 to drive its operation. In examples in which the main switch device 221 is a transistor-based device, the main switch device drive circuit 222 may be connected in electrical communication with that transistor-based device. In the depicted example embodiment of FIG. 4, for example, the main switch device drive circuit 222 is connected in electrical communication with the gate of the MOSFET of the main switch device 221.

The main switch device drive circuit 222 may be configured to drive operation of the main switch device 221 using electrical power from the second output connection or line (i.e. electrical power of a higher voltage than the main switch device 221 is configured to switch with respect to the solenoid 23). This may help to reduce the voltage drop across part of the main switch device 221 and, therefore, improve the efficiency of the operation of the main switch device drive circuit 222 and the main switch device 221.

The main switch device drive circuit 222 may be a transistor-based circuit and may include one or more transistor devices. For example, the main switch device drive circuit 222 may include a first transistor device 222a which is configured to receive a signal from the current comparator circuit 224. The first transistor device 222a may be configured to be actuated to an on-state on receipt of a high signal from the current comparator circuit 224 and may be configured to be actuated to an off-state on receipt of a low signal from the current comparator 224. The main switch device drive circuit 222 may include a second transistor device 222b which is connected in electrical communication with the first transistor device 222a. The actuation of the first transistor device 222a to the on-state may, in turn, cause actuation of the second transistor device 222b to an on-state. Similarly, actuation of the first transistor device 222a to the off-state may, in turn, cause actuation of the second transistor device 222b to an off-state. As will be understood, the first transistor device 222a may be connected in an open collector configuration.

The second transistor device 222b may be further connected to the main switch device 221 such that actuation of the second transistor device 222b to the on-state causes actuation of the main switch device 221 to its on-state, and actuation of the second transistor device 222b to the off-state causes actuation of the main switch device 221 to its off-state.

In the depicted embodiment of FIGS. 4 and 6, for example, the first transistor device 222a is a NPN transistor and the second transistor 222b is a PNP transistor. The base of the first transistor device 222a is configured to be connected in electrical communication with the current comparator circuit 224, the emitter of the first transistor device 222a is connected in electrical communication with the ground line or connection, and the collector of the first transistor device 222a is connected, via a resistor R1, to the base of the second transistor device 222b which is also connected in electrical communication with the second output connection or line, via another resistor R2. The resistor R1, therefore, acts to limit the electrical current to the base of the second transistor device 222b and the resistor R2 biases the second transistor device 222b to its off-state. The emitter of the second transistor device 222b is connected in electrical communication with the second output connection or line and the collector of the second transistor device 222b is connected in electrical communication with the gate of the main switch device 221 and, via further resistor R3, to the source of the main switch device 221 (which is also in electrical communication with the coil 23b).

Thus, as will be appreciated from the example embodiment of FIG. 4, a high signal output by the current comparator circuit 224 will actuate the first transistor 222a into its on-state, which will also actuate the second transistor 222b into its on-state, which will actuate the main switch device 221 to its on-state. Similarly, a low signal output by the current comparator circuit 224 will actuate the first transistor 222a into its off-state, which will also actuate the second transistor 222b into its off-state, which will actuate the main switch device 221 to its off-state.

Thus, in the embodiment of FIG. 4, and some other embodiments, the main switch device drive circuit 222 is configured to drive operation of the main switch device 221 in accordance with the output from the current comparator circuit 224.

The current comparator circuit 224 is configured to compare a signal representative of the electrical current passing through the coil 23b of the solenoid 23, with a signal representative of a predetermined current. If the current passing through the coil 23b is greater than the predetermined current, then the current comparator 224 is configured to output a signal (e.g. the low output signal) which instructs the main switch device drive circuit 222 to control the main switch device 221 to adopt its off-state. If the current passing through the coil 23b is less than the predetermined current, then the current comparator 224 is configured to output a signal (e.g. the high output signal) which instructs the main switch device drive circuit 222 to control the main switch device 221 to adopt its on-state.

Figure 5:
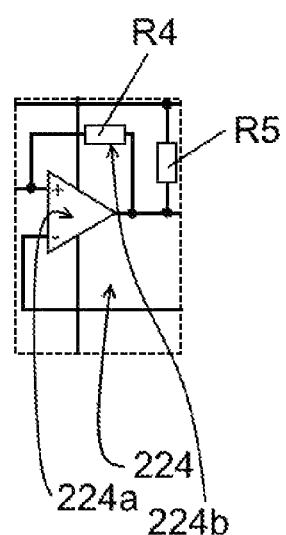
FIG. 5 shows a part of the circuit diagram of FIG. 4 relating to a current comparator circuit of some embodiments.

The current comparator circuit 224 may include a comparator 224a (see FIGS. 4 and 5, for example) which is configured to compare the signal representative of the electrical current passing through the coil 23b of the solenoid 23, with the signal representative of the predetermined current. The output of the comparator 224a may be connected in electrical communication with the main switch device drive circuit 222 (e.g. with the base of the first transistor device 222a in the depicted embodiment of FIG. 4).

The current comparator circuit 224 may include a ripple control circuit 224b which is configured to control the magnitude/amplitude and/or frequency of changes in the output of the current comparator circuit 224 (the output which controls the operation of the main switch device drive circuit 222 (for example, the changes between the high and low output signals which may be delivered to the first transistor device 222a in accordance with the depicted embodiment of FIG. 4)). The ripple control circuit 224b may be configured, in some embodiments, to control the magnitude/amplitude and/or frequency in the ripple of the current through the coil 23b of the solenoid 23; the ripple in the current may, therefore, be referred to as the amplitude and frequency ripple.

The ripple control circuit 224b may include one or more feedback elements which alter one or more inputs to the current comparator circuit 224 in accordance with the output of the current comparator circuit 224. Accordingly, for example, the ripple control circuit 224b may include one or more resistors R4 (see FIG. 5) and may include one or more capacitors (e.g. in series with the one or more resistors R4) which are connected to both the output of the current comparator circuit 224 and an input of the current comparator circuit 224. In the depicted embodiment of FIGS. 4 and 5, the ripple control circuit 224b includes a resistor R4 which is connected in electrical communication with the output of the comparator 224a and the input to the comparator 224a which is the signal representative of the predetermined current—which may be the non-inverting input of the comparator 224a with the inverting input receiving the signal representative of the current through the coil 23b of the solenoid 23.

The output of the current comparator circuit 224 may be tied, for example, to the actuation command signal via another resistor R5. This configuration provides the required input to the main switch device drive circuit 222 when the actuation command signal is high (i.e. indicating that the solenoid 23 is to be activated)—providing high and low inputs as a result of the comparison of the signal representative of the electrical current passing through the coil 23b and the signal representative of the predetermined current—and ensures that the input to the main switch device drive circuit 222 is low when the actuation command signal is low (i.e. when there is no indication that the solenoid 23 should be activated).

Figure 10:
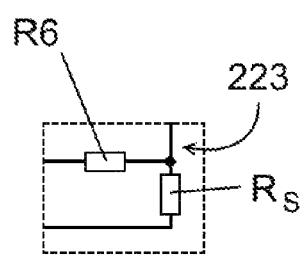
FIG. 10 shows a part of the circuit diagram of FIG. 4 relating to a current sense circuit of some embodiments.

The signal representative of the current passing through the coil 23b of the solenoid 23 is generated by a current sense circuit 223 of the control circuit 22, which is associated with the solenoid 23 (see FIG. 10, for example). The current sense circuit 223 is configured to output the signal representative of the electrical current passing through the coil 23b and may, therefore, be associated with the solenoid 23 and connected in electrical communication with the current comparator circuit 224.

The current sense circuit 223 may include, therefore, a resistor $R_S$ (which may be of a relatively low resistance such as 0.1 Ohms in some embodiments, such as the depicted embodiment of FIGS. 4 and 10) which is connected in series with the coil 23b of the solenoid 23 between the coil 23b and the ground connection or line. As will be appreciated, the voltage of across that resistor $R_S$ will be representative of the current flowing through the coil 23b. Accordingly, the current sensor circuit 223 may include an output which is connected to a terminal of the resistor $R_S$ which is not connected to the ground connection or line. The output from the current sense circuit 223 may include a further resistor R6 as depicted in the example embodiment of FIGS. 4 and 10.

As will be understood, therefore, the output of the current sense circuit 223 is the signal representative of the current passing through the coil 23b.

In some embodiments, the control circuit 22 may include a current shaping circuit 225 (see FIGS. 4 and 7a-7c, for example) which is configured to shape one or more aspects of the electric current provided to the coil 23b of the solenoid 23 through the control circuit 22.

For example, the current shaping circuit 225 may be configured to cause or allow a peak in the current passing through the coil 23b when the main switch device 221 is actuated from the off-state to the on-state. This peak current may be transient, in that its duration is limited to a predetermined period. This peak current may assist in ensuring the correct activation of the solenoid 23, for example, in ensuring that the linear actuator 23a of the solenoid 23 adopts the extended or retracted position with respect to the coil 23b of the solenoid 23. This may require a high initial current—sometimes known as a "pull-in current" (in relation to embodiments in which the current passing through the coil 23b causes the linear actuator 23a to adopt the retracted position and the solenoid 23, therefore, to adopt the retracted configuration). Following the initial high current period, the current through the coil 23b may be reduced such that the average current passing though the coil 23b is a hold-in current—sufficient to retain the solenoid 23 in the retracted configuration).

The current shaping circuit 225 may, therefore, be connected in electrical communication with the current comparator circuit 224 and may be configured to modify the signal representative of the predetermined current such that the signal varies over time. This may include, for example, reducing the magnitude of the signal representative of the predetermined current during an initial period following receipt of the actuation command signal. As such, the current shaping circuit 225 may be configured to receive the actuation command signal and to output the signal representative of the predetermined current. The signal representative of the predetermined current may be dependent on the actuation command signal.

Figure 7A:
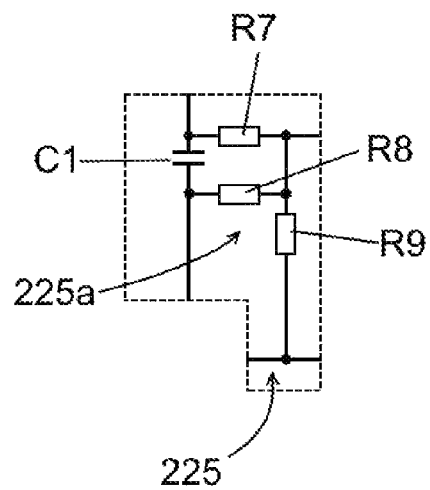
FIGS. 7a-c show current shaping circuits of some embodiments (including that of FIG. 4)

With reference to FIG. 7a, for example, the current shaping circuit 225 may, therefore, comprise a network 225a of one or more resistors R7-R9 and one or more capacitors C1 (and may include one or more other components) which receive the actuation command signal and act on that signal to generate the signal representative of the predetermined current—for provision to the current comparator circuit 224. The network 225a may include first R7 and second R8 resistors which are both connected in electrical communication with an output of the current shaping circuit 225, and which are also both connected to opposing terminals of a capacitor C1. The output of the current shaping circuit 225 may be further connected in electrical communication with the ground connection or line via another resistor R9 of the network 225a. One terminal of the capacitor C1 may be configured to receive the actuation command signal and the other terminal may be connected to the ground connection or line via a diode D1—the diode D1 being oriented to prevent the flow of current from the capacitor C1 to the ground connection or line via the diode D1. The diode D1 may serve to ensure that the operation of the current shaping circuit 225 resets after deactivation of the solenoid 23, so that the current shaping circuit 225 operates correctly for the next activation of the solenoid 23.

In some embodiments, the current shaping circuit 225 could take different forms.

Figure 7B:
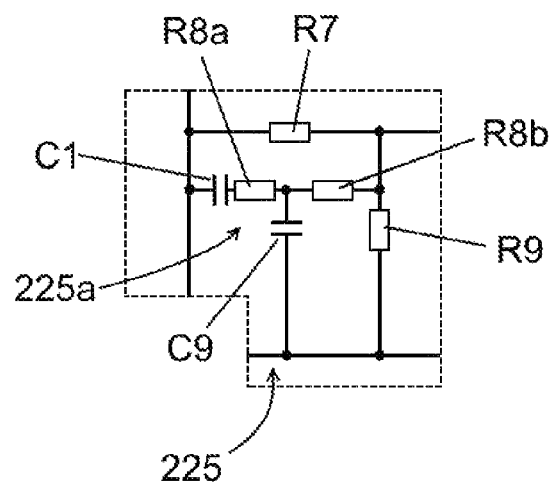

Another example current shaping circuit 225 is shown in FIG. 7b. This example is similar to that in FIG. 7a, except that resistor R8 of the example of FIG. 7a has been separated into two series resistors R8a, R8b. A capacitor C9 is connected in electrical communication between the ground connection or line and the interconnected terminals of the two series resistors R8a, R8b. Further, the first resistor R7 is connected to the ground connection or line via the diode D1 (rather than through the capacitor C1).

The example current shaping circuit 225 of FIG. 7b is an example of an embodiment which includes current rise rate limiting. Other embodiments may also include current rise rate limiting and the circuit to achieve the current rise rate limiting may take a number of different forms.

There may, in some embodiments, be a desire to limit the rate at which current rises in the coil 23b of the solenoid 23—i.e. the rate at which the pull-in current rises. This reduction is relative to the maximum rate of current rise which can be achieved—e.g. by turning the main switch device 221 to its on-state until the pull-in current has reached its peak.

Limiting the current raise rate reduces the speed of movement of the linear actuator 23a. This can be used to reduce the risk of damage to the valve 24—e.g. to a seat of the valve 24.

The current shaping circuit 225 is configured to generate the signal representative of the predetermined current—i.e. a desired current curve for the current which is to pass through the coil 23b of the solenoid 23. This signal representative of the predetermined current may be generated by the current shaping circuit 225 using other analog circuit configurations to those shown. In some embodiments, the current shaping circuit 225 could include a digital circuit configuration—such as in FIG. 7c.

For example, the current shaping circuit 225 could include a digital circuit 225b configured to generate a digital output representative of the signal representative of the predetermined current. The current shaping circuit 225 may further include a digital-to-analog converter 225e which is configured to receive the digital output and to output the signal representative of the predetermined current (which would be an analog signal in this instance). In some embodiments, the digital circuit 225b may include a processor (such as a microprocessor or microcontroller). The processor may be configured to operate in accordance with a program which may be stored in a memory (which may also form part of the digital circuit 225b).

Figure 7C:
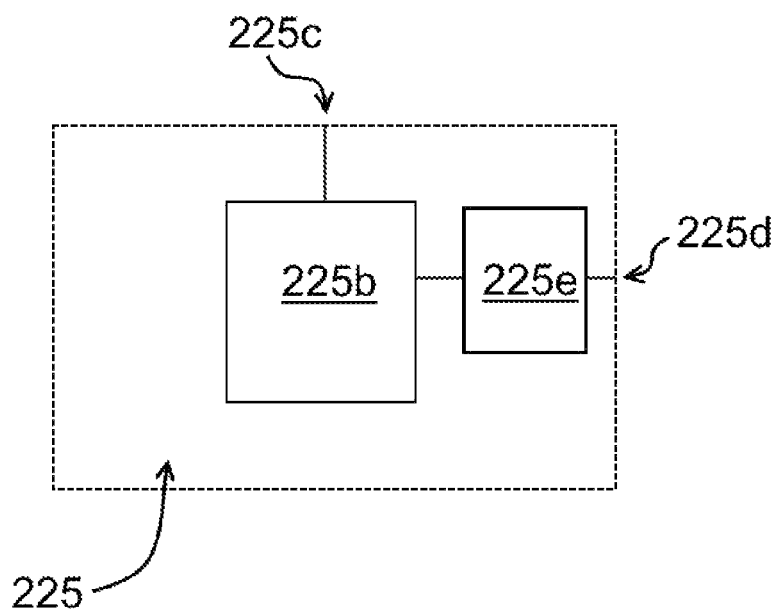

As will be appreciated, in examples in which the current shaping circuit 225 includes the digital circuit 225b, the current shaping circuit 225 may include an input 225c configured to receive the actuation command signal (or a signal representative thereof) and an output 225d configured to output the signal representative of the predetermined current. In some such embodiments, for example as depicted in FIG. 7c, the use of a digital circuit configuration negates the need for the one or more capacitors C1 used in some other example circuits (e.g. see FIGS. 7a and 7b).

Accordingly, the current shaping circuit 225 provides a mechanism by which the signal representative of the predetermined current varies over time (e.g. as the capacitor C1 is charged and discharged during operation).

Figure 8:
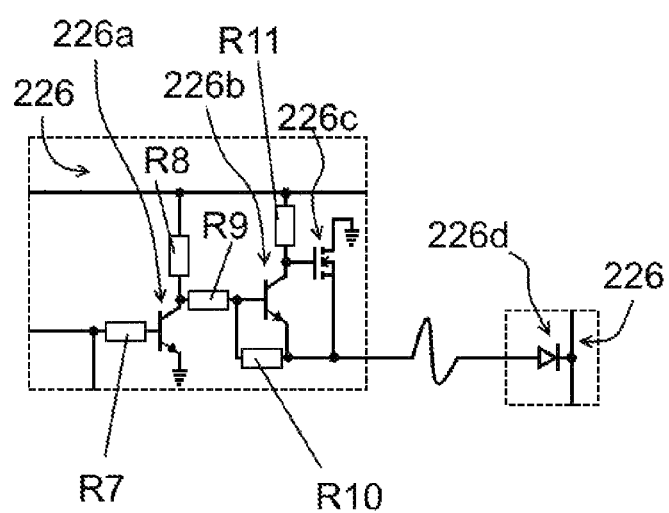
FIG. 8 shows a part of the circuit diagram of FIG. 4 relating to a recirculation circuit of some embodiments.

In some embodiments, the control circuit 22 may further include a recirculation circuit 226—see FIGS. 4 and 8 for example. The recirculation circuit 226 is associated with the coil 23b of the solenoid 23 in some embodiments and is configured to provide a recirculation path for electrical current from the coil 23b of the solenoid 23 when the main switch device 221 is actuated from the on-state to the off-state—due to the inductance in the coil 23b of the solenoid 23 (the solenoid 23 being modelled electrically as a resistor and an inductor in series as depicted in FIG. 4). As will be appreciated, with the recirculation path provided by the recirculation circuit 226, the current through the coil 23b of the solenoid 23 will take longer to reduce than would otherwise be the case.

The recirculation circuit 226 may, in some embodiments, be configured to provide a recirculation path selectively such that the recirculation path may be disconnected and connected depending on the required operation of the control circuit 22. For example, in a first mode of operation the recirculation circuit 226 may be configured to provide the recirculation path for the coil 23b and in a second mode of operation the recirculation path may be broken such that the current is delivered to ground (e.g. via one or more other components) or, in other words, not recirculated to the coil 23b. Actuation between the first mode and second mode of operation may be determined by the actuation command signal. Accordingly, the recirculation circuit 226 may be configured to receive the actuation command signal.

In some embodiments, the recirculation circuit 226 is in the first mode of operation whilst the actuation command signal indicates that the solenoid 23 is to be activated (i.e. in the extended or retracted configuration) and is in the second mode of operation whilst the actuation command signal indicates that the solenoid 23 is to be deactivated (i.e. in the other of the extended or retracted configuration).

The recirculation circuit 226 may include one or more switch devices which may be transistor devices. The one or more switch devices may be configured to connect, selectively, the coil 23b to the ground connection or line such that both ends of the coil 23b are connected in electrical communication with the ground connection or line. In other words, the recirculation circuit 226 may be configured to couple one end or terminal of the coil 23b to the other end or terminal of the coil 23b—such that a current from the coil 23b can recirculate around through the coil 23b. This coupling may be selective such that the recirculation can be prevented or discontinued by operation of the one or more switch devices of the recirculation circuit 226. In some embodiments, the current from the coil 23b will pass through the current sense circuit 223 in both modes of operation of the recirculation circuit 226—i.e. both when the current is recirculated and when the recirculation is prevented or discontinued.

A first recirculation circuit transistor device 226a (of the one or more switch devices of the recirculation circuit 226) may be configured to receive the actuation command signal and to actuate to an on-state (from an off-state) when the actuation command signal is received and to actuate to the off-state when no actuation command signal is received (or when the signal indicates that the solenoid is not to be activated). Actuation of the first recirculation circuit transistor device 226a causes a signal to be applied to one or more further switch devices of the one or more switch devices of the recirculation circuit 226 (which may also be transistor devices) based on the logic circuit voltage. The logic circuit voltage may, therefore, power operation of at least part of the recirculation circuit 226 in some embodiments.

The one or more further switch devices may include a second recirculation circuit transistor device 226b which is configured to actuate to an on-state when the first recirculation circuit transistor device 226a is in its on-state, and to actuate to an off-state when the first recirculation circuit transistor device 226a is in its off-state. This second recirculation circuit transistor device 226b may function as a level translator of the recirculation circuit 226 (in other embodiments, the level translator function may be achieved in other ways, with or without the specific combination of components of the depicted embodiment).

The one or more further switch devices may include a third recirculation circuit transistor device 226c which is configured to actuate to an on-state when the second recirculation circuit transistor device 226b is in its on-state, and to actuate to an off-state when the second recirculation circuit transistor device 226b is in its off-state.

In the on-state, the third recirculation circuit transistor device 226c may be configured to connect an end or terminal of the coil 23b to the ground connection or line (the other end or terminal of the coil 23b being connected to the ground connection or line [e.g., through the current sense circuit 223]).

In some embodiments, such as the depicted embodiment of FIGS. 4 and 8, one or more of the switch devices of the recirculation circuit 226 may each be an NPN transistor or a FET. For example, the first and second recirculation circuit transistor devices 226a, 226b may each be an NPN transistor and the third recirculation transistor device 226c may be a FET (such as an n-channel MOSFET).

In the depicted embodiment of FIGS. 4 and 8, the base of the first recirculation circuit transistor device 226a is configured to receive the actuation command signal via a resistor R7, the collector is connected in electrical communication with the logic circuit power connection or line via a resistor R8 and to the base of the second recirculation circuit transistor device 226b, via another resistor R9. The emitter of the first recirculation transistor device 226a is connected, in this embodiment, to the ground connection or line. The emitter of the second recirculation circuit transistor device 226b is connected to its base via a resistor R10. The collector of the second recirculation circuit transistor device 226b is connected to the logic circuit power connection or line, via a resistor R11. The collector of the second recirculation circuit transistor device 226b is further connected in electrical communication with the gate of the third recirculation circuit transistor device 226c. The drain of the third recirculation circuit transistor device 226c may be connected in electrical communication with the ground connection or line and the collector of the third recirculation circuit transistor device 226c may be connected in electrical communication with a terminal of the coil 23b of the solenoid 23 via a recirculation diode 226d. The recirculation diode 226d is oriented to allow the current to recirculate but to prevent substantial current flowing from the main switch device 221 to the one or more switch devices of the recirculation circuit 226.

The operation of the recirculation circuit 226 allows the energy stored in the coil 23b of the solenoid 23 to be used, in part, to maintain the hold-in current electrical current through the coil 23b. The operation of the recirculation circuit 226 nevertheless still allows the current through the coil 23b to fall quickly on deactivation of the solenoid 23. As will be appreciated, the characteristics of the coil 23b (e.g. the inductance of the coil 23b) will, in part, determine the rate at which energy dissipates from the coil 23b when there is no voltage applied to the coil 23b—i.e. the rate at which the current through the coil 23b decays. Therefore, in embodiments, the coil 23b determines, in part, the timing characteristics for the operation of the control circuit 22.

The current sense circuit 223 (configured to output the signal representative of the current passing through the coil 23b) may be further configured to provide the signal representative of the current passing through the coil 23b to a short circuit detection circuit 227 of the control circuit 22.

The short circuit detection circuit 227 (see FIGS. 4 and 9, for example) is configured to monitor the signal representative of the current passing through the coil 23b for an indication that a short circuit fault has occurred in the coil 23b. Accordingly, the short circuit detection circuit 227 may be in electrical communication with the current sense circuit 223. The short circuit detection circuit 227 may be configured, on detecting a short circuit fault, to alter or otherwise modify the signal representative of the current passing through the coil 23b which is provided to the current comparator circuit 224.

In some embodiments, the short circuit detection circuit 227 is configured to detect the cumulative effect of a short circuit fault over a period of time or over the period over which the solenoid 23 is activated, and to take action only when the cumulative effect exceeds a threshold.

In some embodiments, the short circuit detection circuit 227 is configured to detect the number of occasions the current though the coil 23b of the solenoid 23 (i.e. as sensed by the current sense circuit 223) exceeds a threshold current—e.g. a current indicative of a short circuit fault—and to take action when the number of occasions exceeds a threshold number of occasions.

In some embodiments, the short circuit detection circuit 227 is configured to detect when the total duration of the current though the coil 23b of the solenoid 23 (i.e. as sensed by the current sense circuit 223) exceeds a threshold current—e.g. a current indicative of a short circuit fault—and to take action when the total duration exceeds a threshold duration.

In some embodiments, the short circuit detection circuit 227 may be configured to detect when the magnitude of the current through the coil 23b (e.g. as sensed by the current sense circuit 223) exceeds a threshold magnitude of current—e.g. a current indicative of a short circuit fault—and to take action when that threshold magnitude is exceeded.

In some embodiments, the short circuit detection circuit 227 is configured to take action on the basis of one or more of the number of occasions the current through the coil 23b exceeds a threshold current, the total duration the current through the coil 23b exceeds the threshold current, and the amount by which the threshold current is exceeded. Accordingly, in some embodiments, the short circuit detection circuit 227 may include one or more switch devices which may include a short circuit limit transistor device 227b.

The short circuit detection circuit 227 may include a short circuit detection comparator 227a. The short circuit detection comparator 227a may include a first input connected in electrical communication with the current sense circuit 223 and configured to receive the signal representative of the current passing though the coil 23b of the solenoid 23. The short circuit detection comparator 227a may include a second input which is configured to receive a predetermined reference signal. The short circuit detection comparator 227a is configured to compare the signal representative of the current flowing through the coil 23b with the predetermined reference signal in order to determine whether a short circuit fault has occurred—the predetermined reference signal representing a threshold current.

The short circuit detection comparator 227a may be configured to output a low signal if a short circuit fault is detected (e.g. if the signal representative of the current flowing through the coil 23b is higher than the predetermined reference signal) and to output a high signal if a short circuit fault is not detected (e.g. if the signal representative of the current flowing through the coil 23b is lower than the predetermined reference signal). Accordingly, the predetermined reference signal is such that its level is representative of a condition which may indicate a short circuit fault.

The short circuit detection circuit 227 may be configured to take action if the accumulated duration of time the short circuit detection comparator 227a outputs the low signal exceeds a threshold. This action may include actuating the short circuit limit transistor device 227b to alter or otherwise modify the signal representative of the current passing through the coil 23b.

For example, the short circuit limit transistor device 227b may normally be in an off-state. The output of a low signal from the short circuit detection comparator 227a may cause an accumulation device to accumulate the signal, once the accumulated signal exceeds a threshold, then the short circuit limit transistor device 227b to be actuated to an on-state.

The accumulation device may include, for example, a capacitor C2 and may include one or more resistors R12, R13 in a circuit to achieve the desired accumulation of the signal and output from the short circuit detection comparator 227a. As will be understood, the accumulation device is configured to provide an integrator function.

In the on-state, the short circuit limit transistor device 227b may provide a path of electrical communication from a connection or line carrying the actuation command signal to the connection or line connecting the current sense circuit 223 to the current comparator circuit 224. This path may be through a resistor R11. This serves to pull the signal representative of the current passing through the coil 23b higher (i.e. increase the voltage). When this occurs, the short circuit detection comparator 227a is latched so as to continue to provide a low output until the actuation command signal goes low (i.e. when deactivation of the solenoid 23 is commanded). In addition, the current comparator circuit 224 now receives a modified signal representative of the current flowing through the coil 23b which is higher than the signal representative of the predetermined current. Therefore, the current comparator circuit 224 turns the main switch device 221 to its off-state to deactivate the solenoid 23. Due to the latching effect, this remains the condition of the current comparator circuit 224 (and, therefore, the main switch device 221 and solenoid 23) until the actuation command signal is turned off (i.e. low).

In some embodiments, the short circuit detection circuit 227 may be configured to limit the electrical current through coil 23b of the solenoid 23 in a fault situation but to allow some current to pass through the coil 23b.

As will be understood, the resistor R6 may serve, in the event of a detected fault condition to reduce the electrical current through the coil 23b.

Figure 9:
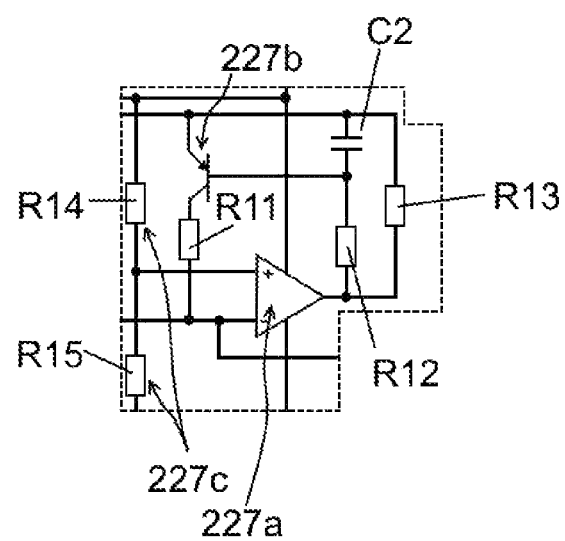
FIG. 9 shows a part of the circuit diagram of FIG. 4 relating to a short circuit detection circuit of some embodiments.

Accordingly, in the depicted embodiment of FIGS. 4 and 9, the inverting input of the short circuit detection comparator 227a is configured to receive the signal representative of the current passing through the coil 23b from the current sense circuit 223. The inverting input is also coupled to connection or line through which the actuation command signal is transmitted, via the resistor R11 and the short circuit limit transistor device 227b (the emitter of which is connected in electrical communication with the connection or line through which the actuation command signal is transmitted, the collector of which is connected in electrical communication with the inverting input, via the resistor R11). The base of the short circuit limit transistor device 227b may be connected to a potential divider formed between the connection or line which carries the actuation command signal and the output of the short circuit limit transistor device 227b. The potential divider may be formed by a capacitor C2 and a resistor R12 and a further resistor R13 may be connected in parallel with the potential divider.

The short circuit limit transistor device 227b may, in the depicted embodiment of FIGS. 4 and 9 for example, be a PNP transistor.

The predetermined reference signal which is indicative of a short circuit fault may be provided by a potential divider threshold circuit 227c formed of two resistors, R14, R15. This potential divider threshold circuit 227c may be connected between, for example, the logic circuit power connection or line and the ground connection or line. In other embodiments, the predetermined reference signal may be determined in some other manner, and/or the potential divider may take a different form.

In some embodiments, the short circuit fault detection circuit 227 is configured such that the level of the predetermined reference signal which is indicative of a short circuit fault varies such that it is at least partially based on the signal representative of the predetermined current. The difference between the predetermined reference signal indicative of the short circuit fault and the signal representative of the predetermined current may vary depending on the level of the signal representative of the predetermined current. Accordingly, in some embodiments, the level of the predetermined reference signal which is indicative of a short circuit fault may be the same as the signal representative of the predetermined current plus a margin (i.e. a predetermined amount). In some embodiments, that margin may be fixed or may be a first margin when the signal representative of the predetermined current is indicative of the pull-in current and a second margin when the signal representative of the predetermined current is indicative of the hold-in current (the first margin may be greater than the second margin).

The control circuit 22 may include one or more further components in accordance with some embodiments. For example, the control circuit 22 may include one or more regulation components which are configured to filter and/or regulate the electrical power which is received from the electrical supply system 3 and/or the actuation command signal. For example, the logic circuit power connection or line may be coupled in electrical communication with a capacitor C3 which is also coupled to the ground connection or line.

As will be appreciated, the example circuit diagram depicted in FIGS. 4 to 10 is one example implementation of the invention only.

In normal operation (i.e. not including fault situations such as the occurrence of a short circuit fault), an actuation command signal is sent to the control circuit 22 of the braking system 2 indicating that the solenoid 23 is to be activated (e.g. actuated to the retracted configuration from the extended configuration).

The actuation command signal causes the generation of the signal representative of the predetermined current, which may be shaped or otherwise modified by the current shaping circuit 225. The current comparator circuit 224 may compare the signal representative of the current flowing through the coil 23b with the signal representative of the predetermined current. As no current will be flowing through the coil 23b, the current comparator circuit 224 will issue a signal to the main switch device drive circuit 222 to actuate the main switch device 221 to the on-state. This will, in turn, cause a current to flow through the coil 23b. During this stage, the current shaping circuit 225 may cause or allow a peak current to flow through the coil 23b for an initial period before the mean current flowing through the coil 23b reduces to an operating level.

The current flowing through the coil 23b increases until the current comparator circuit 224 determines that the signal representative of the current flowing through the coil 23b has reached or exceeded the signal representative of the predetermined current. The current comparator circuit 224 then issues a signal to the main switch device drive circuit 222 to actuate the main switch device 221 to the off-state.

The recirculation circuit 226, in the meantime, is operating in the first mode (due to the receipt by the recirculation circuit 226 of the actuation command signal) such that current from the coil 23b recirculates and so the current though the coil 23b drops relatively slowly. The current though the coil 23b and, therefore, the signal representative of the current through the coil 23b will fall below the signal representative of the predetermined current and the current comparator circuit 224 will issue a signal to cause the main switch device drive circuit 222 to actuate the main switch device 221 to the on-state. The current through the coil 23b will, therefore, increase again, and so on.

Figure 11:
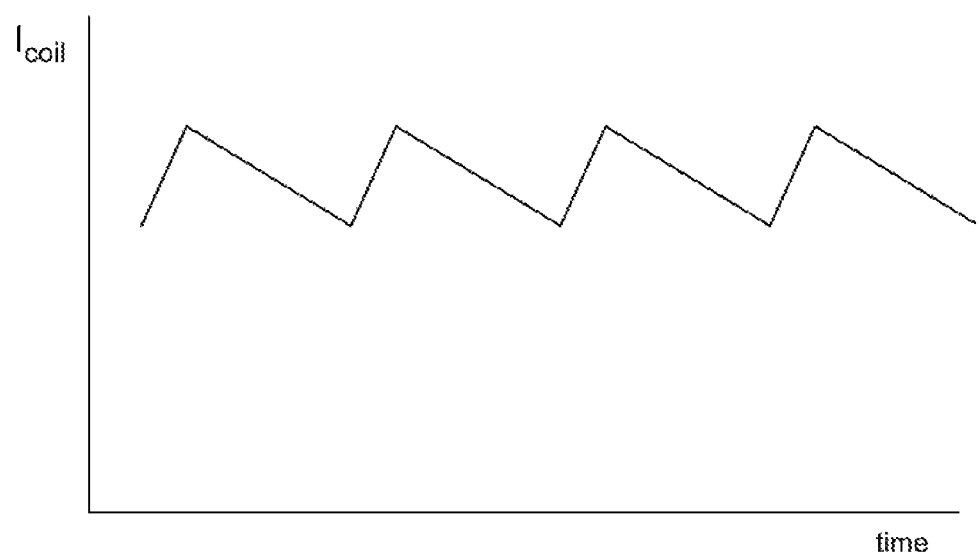
FIG. 11 shows a simplified graphical representation of the variation in current flowing through the coil of a solenoid according to some embodiments.

FIG. 11 shows a graphical representation of the current, $I_{coil}$, flowing through the coil 23b during normal operation with the solenoid 23 activated. As will be appreciated, the current through the coil 23b of the solenoid 23 is selectively (e.g. alternately) provided through the main switch device 221 and the recirculation circuit 226 and may maintain an average (e.g. mean) current through the coil 23b when the solenoid 23 is activated. Thus, the current through the coil 23b rises as current passes through the main switch device 221 to a peak, the main switch device 221 is actuated to its off-state, and the current from the coil 23b is then recirculated through the coil 23b resulting in a decreasing current through the coil 23b until a low current point is reached and the main switch device 221 is actuated to the on-state and the cycle is repeated.

Figure 12:
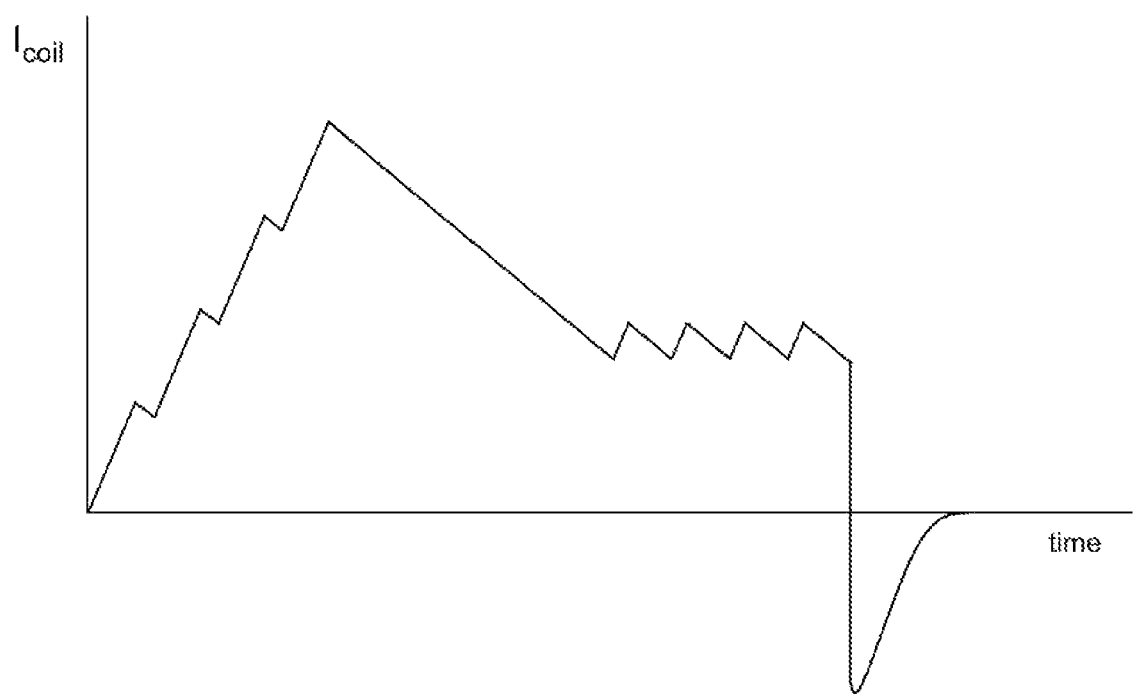
FIG. 12 shows a simplified graphical representation of the variation in current flowing through the coil of a solenoid according to some embodiments including a pull-in current.

FIG. 12 shows a graphical representation of the current, $I_{coil}$, flowing through the coil 23b during normal operation with the solenoid 23 activated including an initial period in which a higher, pull-in, current passes through the coil 23b. The figure also shows the effect of the current limiting of some embodiments during the initial rise of the electrical current through coil 23b.

If the actuation command signal indicates that the solenoid 23 is to be deactivated, then the signal indicative of the predetermined current will reduce to substantially zero. Therefore, the current comparator circuit 224 will issue a signal to the main switch device drive circuit 222 to actuate the main switch devices 221 to the off-state.

In the meantime, the recirculation circuit 226 will operate in the second mode (due to the removal of the actuation command signal). Therefore, the current from the coil 23b will not recirculate. Therefore, the current will reduce relatively quickly. This allows for a relatively fast deactivation of the solenoid 23. The effect of the operation of the recirculation circuit 226 on the current through the coil 23b is also shown in FIG. 12.

As will be appreciated, embodiments of the present invention provide for relatively fast control of the operation of the solenoid 23 which is not dependent on the operating frequency of a microcontroller or microprocessor-based controller. Embodiments of the present invention may not require a microcontroller or microprocessor to modify a pulse width of the electrical power applied to the solenoid 23 in response to variations in the supply voltage or the electrical resistance of the solenoid coil 23b.

As will also be understood, the recirculation current from the coil 23b of the solenoid 23 is used in normal operation to activate the solenoid (e.g. pull-in and/or hold-in the solenoid). This is, according to some embodiments, an efficient way in which to operate the solenoid 23 both in terms of the numbers of components needed and in electrical power usage. The time required to discharge the coil 23b contributes to the modulation of the signal which passes through the coil 23b to control its operation. This arrangement is relatively tolerant to variations in inductance of the coil 23b caused by temperature variations during operation.

Elements of some embodiments, however, allow the controlled operation of the recirculation of the current from the coil 23b ensuring that the solenoid can be deactivated quickly.

Embodiments of the invention are also able to operate on a wide range of different operating voltages (e.g. a range of different first and second supply voltages) and can accommodate fluctuations in those voltages more readily than some prior arrangements.

Embodiments of the invention can also reduce the current through the coil 23b in the event of a short circuit fault—reducing power loss and the risk of harm to other components.

As the control of the current passing through the coil 23b (i.e. actuation of the main switch device 221) does not, in accordance with some embodiments, require the direct operation of a microcontroller or microprocessor-based controller, the complexity of the programming of any such devices used in embodiments of the invention is decreased.

Some embodiments of the present invention use a corresponding technique (regarding the use of the recirculation current from the coil 23b in providing a drive modulation for the main switch device 221) for driving the operation of the coil of a relay 231.

Figure 13:
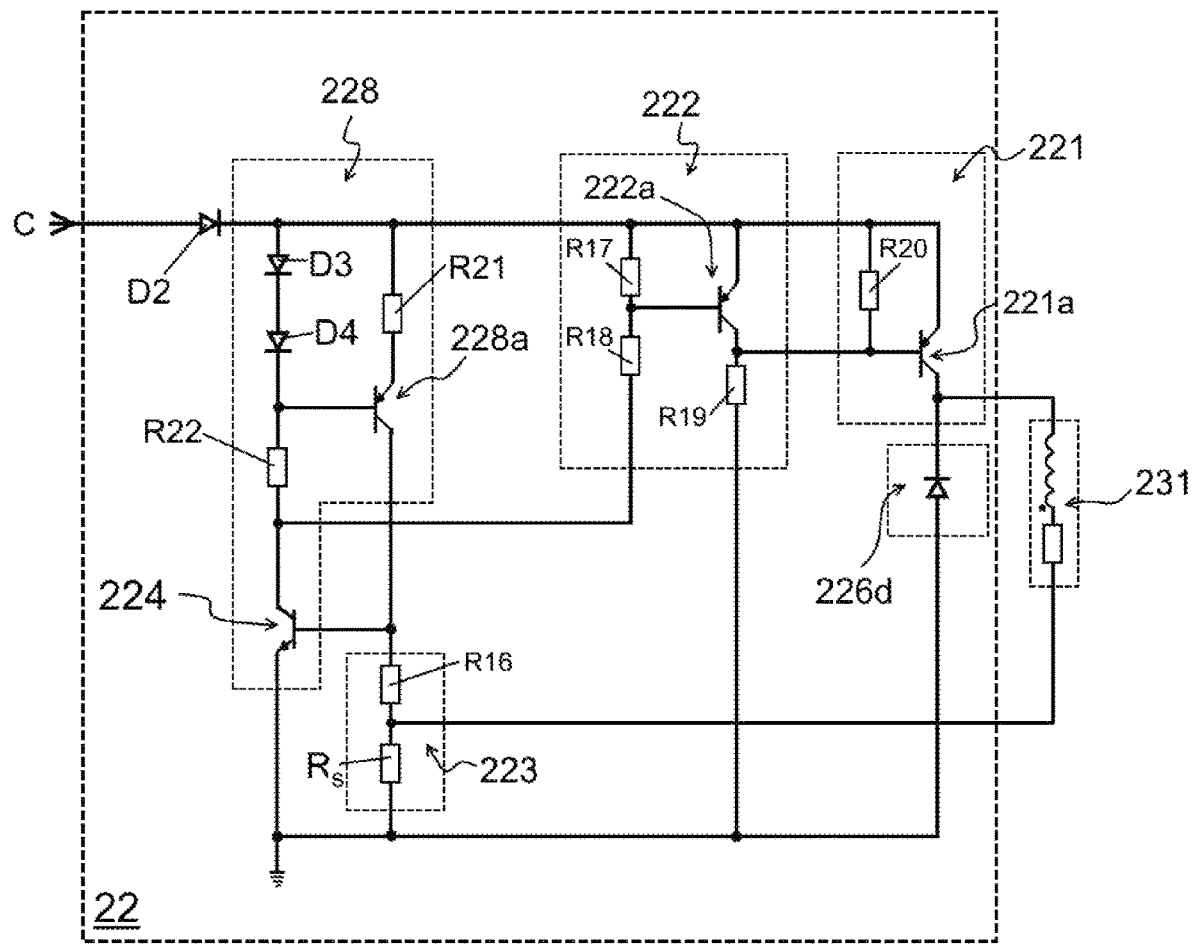
FIG. 13 shows a circuit diagram of an embodiment.

In this regard, reference is made to FIG. 13, for example. Many of the features of this embodiment are functionally similar to those of the embodiment of FIGS. 4-12.

In particular, according to some such embodiments, the relay 231 includes a coil which is comparable to the coil 23b of the solenoid 23. In particular, activation of the relay 231 is achieved by passing a current through the coil of the relay 231. Activation of the relay 231 may close an electrical switch which forms part of the relay 231, for example. The actuation of the electrical switch may cause the control of a part of the vehicle 1 which may include at least part of the braking system 2.

The control circuit 22 may be provided to control the provision of electric current to the coil of the relay 231, and FIG. 13 provides an example of an embodiment of the control circuit 22 and relay 231.

Again, the control circuit 22 may be coupled in electrical communication with the electrical supply system 3 which may be configured to provide electrical power to the control circuit 22 and, hence, to the relay 231.

In this and some other embodiments, the control system 21 is provided (much like the control system 21 discussed above). The control system 21 may be configured to output an actuation command signal (e.g. based on instructions received from the mechanism for user input 21a and/or the braking control processor 21b).

In some embodiments, the control system 21 is coupled in electrical communication with the electrical supply system 3, and the electrical supply system 3 is coupled to the control circuit 22 via the control system 21.

In this and some other embodiments, the actuation command signal is used to provide the electrical power to the relay 231 for its actuation.

The current sense circuit 223 may be provided as part control circuit 22. The current sense circuit 223 may include a resistor, $R_S$, which may be a relatively low resistance. This resistor is connected in series with the coil of the relay 231 so that the electrical current passing through the coil of the relay 231 will also pass through this resistor. As will be appreciated, the voltage across this resistor will be proportional to the current which is passing through the coil of the relay 231. The current sense circuit 223 is, therefore, configured to output a signal representative of the current flowing through the coil of the relay 231.

The current sense circuit 223 may include one or more further resistors R16 which are arranged in series with the resistor, $R_S$.

The current sense circuit 223 is connected in electrical communication with a current source circuit 228, which may be referred to as a hysteresis current source circuit 228.

The current source circuit 228 is configured to receive the actuation command signal, C. This may be received via a protection diode, D2, for example.

The current sense circuit 223 is further connected in electrical communication with the current comparator circuit 224 which may be viewed as part of the current source circuit 228 in some embodiments. In some embodiments, the current sense circuit 223 may perform comparable operations to the current shaping circuit 225 of other embodiments, and references to the current shaping circuit 225 as used herein should be construed as encompassing these aspects of the current source circuit 228 unless otherwise indicated. The current comparator circuit 224 may include a current comparator switch device 224—which may be a transistor based device (e.g. an NPN transistor device).

In this and some other embodiments, the current comparator circuit 224 with the current source circuit 228 are configured to compare the signal representative of the current flowing through the coil of the relay 231 (as provided by the current sense circuit 223) with a signal representative of a predetermined current—determined by the current source circuit 228.

If the current passing through the coil of the relay 231 is less than a threshold current determined from the signal representative of the predetermined current, then the main switch device drive circuit 222 controlled to actuate the main switch device 221 to its on-state. If the current passing through the coil of the relay 231 is greater than a threshold current determined from the signal representative of the predetermined current, then the main switch device drive circuit 222 is controlled to actuate the main switch device 221 to its off-state.

The current source circuit 228 may, in some embodiments including the depicted embodiment of FIG. 13, include one or more switch devices which may be transistor devices. In some examples, the current source circuit 228 includes a first switch device 228a and the current comparator switch device 224.

The first switch device 228a may be a transistor device and may be a PNP transistor device. The base of the first switch device 228a may be connected in electrical communication with one or more diodes (e.g. two diodes, D3, D4), which may be connected in series with the actuation command signal (which may be carried by a corresponding connection or line). The emitter of the first switch device 228a may be connected in electrical communication with the actuation command signal via a resistor R21. The base of the first switch device 228a may be further connected in electrical communication with the collector of the current comparator switch device 224, via a further resistor R22. The collector of the first switch device 228a may be connected in electrical communication with the further resistor, R16, of the current sense circuit 223. The base of the current comparator switch device 224 may also be connected in electrical communication with the further resistor R16 of the current sense circuit 223. The emitter of the current comparator switch device 224 may be connected in electrical communication with the ground connection or line. In the depicted embodiment, the first switch device 228a is a PNP transistor and the current comparator switch device 224 is an NPN transistor.

As will be appreciated, the first and current comparator switch devices 228a, 224 of the current source circuit 228/current comparator 224a act together in response to the signal from the current sense circuit 223 to control the operation of the main switch device drive circuit 222.

The main switch device drive circuit 222 includes a switch device, which may be a transistor device 222a (which may be a PNP transistor in some embodiments). The main switch device drive circuit 222 may be associated with one or more resistors R17, R18 which are configured to moderate the signal which causes switching of the switch device (such as the transistor device 222a). The one or more resistors R17, R18 may include a resistor R17 which is coupled in electrical communication with the actuation command signal (or the line or connection carrying the signal) and the switch device (e.g. to the base of the transistor device 222a). Accordingly, the resistor R17 may tie the base of the transistor device 222a to the actuation command signal.

The one or more resistors R17, R18 may include a further resistor R18 which is also connected in electrical communication with the current source circuit 228 and, in some embodiments in particular, with the collector of the current comparator switch device 224—this creates a potential divider when the current comparator switch device 224 is in its on-state to pull the base of the transistor device 222a of the main switch device drive circuit 222 towards ground and cause the actuation of the transistor device 222a of the main switch device drive circuit 222.

The emitter of the transistor device 222a of the main switch device drive circuit 222 may be connected in electrical communication with the actuation command signal. The collector of the transistor device 222a may be connected in electrical communication with the ground connection or line via a resistor, R19.

An output of the main switch device drive circuit 222 is connected in electrical communication with the main switch device 221 and is configured to drive its operation. Accordingly, the main switch device 221 may include a transistor device 221a—which may include a PNP transistor device. An emitter of the transistor device 221a may be connected in electrical communication with the actuation command signal, and the collector may be connected in electrical communication with the coil of the relay 231 and to the recirculation diode 226d (which may also be connected in electrical communication with the ground connection or line). The base of the transistor device 221a may be connected in electrical communication with the main switch device drive circuit 222 (e.g. with the collector of the transistor device 222a thereof). A resistor R20 of the main switch device 221 (or associated therewith) may tie the base of the transistor 221a to the actuation command signal.

Accordingly, in the depicted embodiment (and some other embodiments), when the transistor device 222a of the main switch device drive circuit 222 is in its on-state the main switch device 221 (and, in particular, the transistor device 221a of the main switch device 221) will be in its off-state. Similarly, when the transistor device 222a of the main switch device drive circuit 222 is in its off-state the main switch device 221 (and, in particular, the transistor device 221*a* of the main switch device 221) will be in its on-state.

Thus, operation of the current source circuit 228/current comparator circuit 224 to control the actuation of the main switch device drive circuit 222 to actuate the main switch device 221 to its on-state causes a current to flow through the coil of the relay 231 to activate the relay. This current will increase until a threshold is reached (determined by comparison of the signal representative of the current flowing through the coil of the relay 231 with the signal representative of the predetermined current as set in the current source circuit 228). The current source circuit 228/current comparator circuit 224 will then cause the actuation of the main switch device drive circuit 222 (and, in particular the transistor device 222*a* thereof) to cause the main switch device 221 (and, in particular, the transistor device 221*a*) to the off-state. Due to the inductance of the coil of the relay 231 (which may be modelled as an inductor and a resistor electrically), a current will flow from the coil as the current to the coil via the main switch device 221 is reduced. This current is recirculated through the coil of the relay 231 via the recirculation diode 226*d*. When the signal representative of the current through the coil drops below the predetermined level, then the current source circuit 228/current comparator circuit 224 causes the actuation of the main switch device 221 again, and so on.

The current through the coil of the relay 231 will, therefore, resemble the depiction in FIG. 11.

The interaction of the current source circuit 228 and current comparator circuit 224 means that the two circuits are more readily considered together. As will be appreciated, the current source circuit 228 provides hysteresis in the operation of the current comparator circuit 224 by providing a current to the current comparator circuit 224 (e.g. to the base of the switch device 224 thereof) to increase the voltage (e.g. on the base) to modify its operation.

It is worth noting, for example, that the current source circuit 228 and current comparator circuit 224 combination of the embodiment of, for example, FIG. 13 acts, in many respects, like the current comparator circuit 224 of other embodiments. In some embodiments, therefore, the current source circuit 228 (including the current comparator circuit 224) may be classed as an example of the current comparator circuit 224 of other embodiments.

The current source circuit 228, indeed, provides some of the functionality of the current shaping circuit 225 of some embodiments as described herein.

In accordance with embodiments, the signal representative of the predetermined current may vary over time so as to follow, substantially, a desired current through the coil 23*b* of the solenoid 23 or relay 231. This signal representative of the predetermined current may also fluctuate (i.e. ripple) over time in order to define the levels at which the main switch device 221 is switched to achieve the desired current through the coil 23*b* of the solenoid 23 or relay 231. There is, therefore, hysteresis in this signal and this is provided at least in part by the current shaping circuit 225 and/or the current source circuit 228 of embodiments of the invention. Accordingly, the current shaping circuit 225 and/or current source circuit 228 may be configured, in some embodiments, to provide a hysteresis function on the signal representative of the predetermined current.

As will be understood, the signal representative of the predetermined current may define an upper bound at which the main switch device 221 is to be actuated to its off-state, and a lower bound at which the main switch device 221 is to be actuated to its on-state.

In some embodiments, these upper and lower bounds may be defined using different configurations of components. For example, the upper and lower bounds could be separately defined—providing an upper bound signal and a lower bound signal which substantially follow a signal indicative of the desired current through the coil 23*b* of the solenoid 23 or relay 231.

As will be appreciated, the electrical current typically required for the operation of the relay 231 is significantly lower than is typically required for the operation of the solenoid 23. Therefore, features such as the comparator 224*a* are not required but could be included in some embodiments. The current associated with a short circuit fault is also lower and so this can be handled in the same manner as a high current through the coil of the relay 231 without the need for dedicated components to sense the short circuit situation. The selective recirculation of the current from the coil of the relay 231 is not required in some such embodiments but could be included in others if there is a need to eliminate the recirculation current quickly in a particular embodiment.

Accordingly, the embodiment of FIG. 13 achieves many of the same advantages as the embodiment of FIGS. 4-12.

As will be appreciated, a relay and a solenoid are two examples of inductive load devices which are actuators, using electromagnetic coils for their operation (which are, in turn, examples of an inductive load). Indeed, the arrangement depicted in FIG. 3 could equally be applied to the operation of the relay 231 instead of the solenoid 23. In addition, the elements of FIG. 3 (and the more detailed circuit components of an embodiment those elements depicted in FIG. 4) may be incorporated into and/or substituted with the elements of FIG. 13 and vice versa.

It will be appreciated that embodiments of the present invention have been described in relation to specific example embodiments involving the solenoid 23. That solenoid 23 is an example of an inductive load device, and the example of that inductive load device being part of the braking system 2 is, again, merely an example. The same principles can be applied to driving the operation of other forms of inductive load and inductive load devices. Therefore, embodiments of the present invention include the driving of inductive loads (e.g. inductive load devices) and the circuits required for this purpose generally as described herein.

In some embodiments, the control circuit 22 includes an inductance determining circuit (not shown). The inductance determining circuit is configured to determine an inductance of the inductive load device (e.g. of the inductive load such as the coil 23*b* of the solenoid 23 or relay 231) based on the ripple frequency of current through the inductive load device (and/or the rise rate or fall rate of the current through the inductive load device). This inductance may be a relative inductance—e.g. relative to a range of inductances of the inductive load during normal operation thereof. This ripple frequency is the self-oscillating frequency of the inductive load device. As this frequency is dependent on the inductance of the inductive load device, therefore, the inductance can be determined.

The determined inductance may be used, e.g. by the control circuit 22 (and may be by the inductance determining circuit), to determine the configuration or a state of the inductive load device (such as the solenoid 23 or relay 231).

For the solenoid 23, for example, the position of the linear actuator 23a with respect to the coil 23b alters the inductance of the coil 23b. Therefore, the determined inductance can be compared, in some embodiments, by the inductance determining circuit to one or more predetermined inductance levels associated with known positions of the linear actuator 23a with respect to the coil 23b.

The inductance determining circuit may be further configured to identify a potential fault situation in which the linear actuator 23a is not in the expected position with respect to the coil 23b. For example, if—following application of the pull-in current—the linear actuator 23a is not pulled-in (as determined by the inductance determining circuit) then a fault situation may be determined to have occurred. As a result of the identification of a fault situation, the operation of the control circuit 22 may be modified—for example to cease activation or attempted activation of the solenoid 23.

Likewise, when the solenoid 23 is deactivated, the inductance determining circuit may be configured to determine whether the linear actuator 23a has or has not returned to the extended configuration with respect to the coil 23b—i.e. another example of a fault situation. In such fault situations, the operation of the control circuit 22 may be modified—for example to re-activate and then deactivate the solenoid 23 again.

In some embodiments, the inductance determining circuit is connected to current shaping circuit 225 and is configured to modify the signal representative of the predetermined current dependent on the position of the linear actuator 23a with respect to the coil 23b. For example, the inductance determining circuit may be configured to determine when the linear actuator 23a has reached its pulled-in position with respect to the coil 23b and to alter the signal representative of the predetermined current to reduce the current through the coil 23b from the pull-in current to the hold-in current.

The position of the linear actuator 23a with respect to the coil 23b is an example of a state of operation of the solenoid 23 which may be derived from the inductance by the inductance determining circuit.

This may reduce the power lost through the coil 23b (e.g. through heating of the coil 23b) whilst still ensuring correct operation of the solenoid 23.

When used in this specification and claims, the terms "comprises" and "comprising" and variations thereof mean that the specified features, steps or integers are included. The terms are not to be interpreted to exclude the presence of other features, steps or components.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

The invention claimed is:

1. A vehicle braking system control circuit for controlling the operation of a main switch device which manages an electrical current delivered to an inductive load device, the control circuit including:
a current sense circuit configured to be coupled to the switch device and to output a signal representative of an electrical current through the inductive load device;
a current comparator circuit configured to receive an actuation command signal, compare the signal representative of the electrical current through the inductive load device with a signal representative of a predetermined current, and to output a control signal based on the comparison for controlling the operation of the main switch device when the actuation command signal indicates that the inductive load device is to be activated;
a recirculation circuit configured to recirculate current through the inductive load device, such that the current used to activate the inductive load device is selectively provided by the main switch device and the recirculation circuit with the recirculation current from the inductive load device providing a drive modulation for the main switch device; and
a current shaping circuit which is configured to cause a limit to be applied on the rate of rise of the electrical current through the inductive load device.

2. A control circuit according to claim 1, wherein the recirculation circuit is configured to provide a recirculation path for the current through the inductive load device selectively, such that when the actuation command signal indicates that the inductive load device is to be deactivated, recirculation of the current is ceased.

3. A control circuit according to claim 1, further comprising a main switch device drive circuit which is configured to receive the control signal from the current comparator circuit and to drive the operation of the main switch device in accordance with the control signal.

4. A control circuit according to claim 1, wherein the current shaping circuit includes a processor configured to output a signal indicative of the signal representative of the predetermined current.

5. A control circuit according to claim 1, further comprising a short circuit detection circuit which is configured to detect a short circuit fault and to modify the signal representative of the current through the inductive load device or the signal representative of the predetermined current, such that the control signal is modified to reduce the current through the inductive load device.

6. A control circuit according to claim 1, wherein the current comparator circuit includes a comparator which is configured to compare the signal representative of the electrical current through the inductive load device with the signal representative of the predetermined current.

7. A control circuit according to claim 6, wherein the comparator circuit includes a ripple control circuit which is configured to control at least one of the ripple frequency and ripple amplitude of the current through the inductive load device.

8. A control circuit according to claim 1, wherein the current comparator circuit includes a current source circuit which is configured to provide the signal representative of the predetermined current.

9. A control circuit according to claim 1, wherein the inductive load device includes a coil and is a solenoid or relay.

10. A control circuit according to claim 1, further including an inductance determining circuit which is configured to determine an inductance of the inductive load device and to derive a state of operation of the inductive load device from the determined inductance.

11. A braking system for a vehicle, the braking system including:
a vehicle braking system control circuit for controlling the operation of a main switch device which manages an electrical current delivered to an inductive load device, the control circuit including:

a current sense circuit configured to be coupled to the switch device and to output a signal representative of an electrical current through the inductive load device;

a current comparator circuit configured to receive an actuation command signal, compare the signal representative of the electrical current through the inductive load device with a signal representative of a predetermined current, and to output a control signal based on the comparison for controlling the operation of the main switch device when the actuation command signal indicates that the inductive load device is to be activated;

a recirculation circuit configured to recirculate current through the inductive load device, such that the current used to activate the inductive load device is selectively provided by the main switch device and the recirculation circuit with the recirculation current from the inductive load device providing a drive modulation for the main switch device;

a current shaping circuit which is configured to cause a limit to be applied on the rate of rise of the electrical current through the inductive load device; and the inductive load device which is configured to be controlled by the control circuit and the main switch device.

12. A vehicle including a braking system for a vehicle, the braking system including:

a vehicle braking system control circuit for controlling the operation of a main switch device which manages an electrical current delivered to an inductive load device, the control circuit including:

a current sense circuit configured to be coupled to the switch device and to output a signal representative of an electrical current through the inductive load device;

a current comparator circuit configured to receive an actuation command signal, compare the signal representative of the electrical current through the inductive load device with a signal representative of a predetermined current, and to output a control signal based on the comparison for controlling the operation of the main switch device when the actuation command signal indicates that the inductive load device is to be activated;

a recirculation circuit configured to recirculate current through the inductive load device, such that the current used to activate the inductive load device is selectively provided by the main switch device and the recirculation circuit with the recirculation current from the inductive load device providing a drive modulation for the main switch device;

a current shaping circuit which is configured to cause a limit to be applied on the rate of rise of the electrical current through the inductive load device; and the inductive load device which is configured to be controlled by the control circuit and the main switch device.

13. A vehicle according to claim 12, wherein the vehicle includes a truck with the braking system located in the truck or a truck and a trailer with the braking system located in the trailer and/or the truck.

14. A vehicle braking system control circuit for controlling the operation of a main switch device which manages an electrical current delivered to an inductive load device, the control circuit including:

a current sense circuit configured to be coupled to the switch device and to output a signal representative of an electrical current through the inductive load device;

a current comparator circuit configured to receive an actuation command signal, compare the signal representative of the electrical current through the inductive load device with a signal representative of a predetermined current, and to output a control signal based on the comparison for controlling the operation of the main switch device when the actuation command signal indicates that the inductive load device is to be activated;

a recirculation circuit configured to recirculate current through the inductive load device, such that the current used to activate the inductive load device is selectively provided by the main switch device and the recirculation circuit with the recirculation current from the inductive load device providing a drive modulation for the main switch device; and an inductance determining circuit which is configured to determine an inductance of the inductive load device and to derive a state of operation of the inductive load device from the determined inductance.

15. A braking system for a vehicle, the braking system including:

a vehicle braking system control circuit for controlling the operation of a main switch device which manages an electrical current delivered to an inductive load device, the control circuit including:

a current sense circuit configured to be coupled to the switch device and to output a signal representative of an electrical current through the inductive load device;

a current comparator circuit configured to receive an actuation command signal, compare the signal representative of the electrical current through the inductive load device with a signal representative of a predetermined current, and to output a control signal based on the comparison for controlling the operation of the main switch device when the actuation command signal indicates that the inductive load device is to be activated;

a recirculation circuit configured to recirculate current through the inductive load device, such that the current used to activate the inductive load device is selectively provided by the main switch device and the recirculation circuit with the recirculation current from the inductive load device providing a drive modulation for the main switch device;

an inductance determining circuit which is configured to determine an inductance of the inductive load device and to derive a state of operation of the inductive load device from the determined inductance; and an inductive load device which is configured to be controlled by the control circuit and the main switch device.

16. A vehicle including a braking system for a vehicle, the braking system including:

a vehicle braking system control circuit for controlling the operation of a main switch device which manages an electrical current delivered to an inductive load device, the control circuit including:

a current sense circuit configured to be coupled to the switch device and to output a signal representative of an electrical current through the inductive load device;

a current comparator circuit configured to receive an actuation command signal, compare the signal representative of the electrical current through the inductive load device with a signal representative of a predetermined current, and to output a control signal based on the comparison for controlling the operation of the main switch device when the actuation command signal indicates that the inductive load device is to be activated;

a recirculation circuit configured to recirculate current through the inductive load device, such that the current used to activate the inductive load device is selectively provided by the main switch device and the recirculation circuit with the recirculation current from the inductive load device providing a drive modulation for the main switch device;

an inductance determining circuit which is configured to determine an inductance of the inductive load device and to derive a state of operation of the inductive load device from the determined inductance; and an inductive load device which is configured to be controlled by the control circuit and the main switch device.

* * * * *